US012671887B2

(12) United States Patent
Solar

(10) Patent No.: US 12,671,887 B2
(45) Date of Patent: *Jun. 30, 2026

(54) VEHICULAR FORWARD CAMERA MODULE WITH COOLING FAN

(71) Applicant: Magna Electronics Inc., Auburn Hills, MI (US)

(72) Inventor: Martin Solar, Erlenbach (DE)

(73) Assignee: Magna Electronics Inc., Auburn Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/907,802

(22) Filed: Oct. 7, 2024

(65) Prior Publication Data

US 2025/0030934 A1      Jan. 23, 2025

Related U.S. Application Data

(63) Continuation of application No. 17/303,962, filed on Jun. 11, 2021, now Pat. No. 12,120,408, which is a
(Continued)

(51) Int. Cl.
| *H04N 23/52* | (2023.01) |
| *B60R 11/04* | (2006.01) |
(Continued)

(52) U.S. Cl.
CPC ............. *H04N 23/52* (2023.01); *B60R 11/04* (2013.01); *G03B 17/55* (2013.01); *H04N 23/51* (2023.01);
(Continued)

(58) Field of Classification Search
CPC ........ H04N 23/52; H04N 23/51; B60R 11/04; B60R 2011/0026; B60R 2011/0094; G03B 17/55; H05K 7/20136; H05K 7/2039
(Continued)

(56) References Cited

U.S. PATENT DOCUMENTS

| 6,690,268 B2 | 2/2004 | Schofield et al. |
| 6,824,281 B2 | 11/2004 | Schofield et al. |
(Continued)

FOREIGN PATENT DOCUMENTS

| CN | 106059287 A | 10/2016 |
| WO | 2020159914 A1 | 8/2020 |

OTHER PUBLICATIONS

International Search Report and Written Opinion dated Apr. 14, 2020 for corresponding PCT Application No. PCT/US2020/015306, filed Jan. 28, 2020.

*Primary Examiner* — Matthew David Kim
(74) *Attorney, Agent, or Firm* — HONIGMAN LLP

(57) ABSTRACT

A windshield electronics module disposed at a vehicle includes a camera module having a camera housing that accommodates a camera and circuitry. The camera housing includes lower heat dissipating fins and rear heat dissipating fins. A cooling fan assembly is mounted at a lower portion of the camera housing. The cooling fan assembly draws air from an interior cabin of the vehicle via an air intake of the vehicular windshield electronics module and directs the drawn air as airflow (i) in a radial direction with respect to an axis of rotation of the fan blades, and (ii) in an axial direction with respect to the axis of rotation of the fan blades. The cooling fan assembly directs the drawn air as airflow (i) in the radial direction along and between the lower heat dissipating fins, and (ii) in the axial direction along and between the rear heat dissipating fins.

37 Claims, 8 Drawing Sheets

Related U.S. Application Data continuation-in-part of application No. 16/968,177, filed as application No. PCT/US2020/015306 on Jan. 28, 2020, now Pat. No. 11,290,622.

(60) Provisional application No. 62/705,113, filed on Jun. 11, 2020, provisional application No. 62/797,469, filed on Jan. 28, 2019.

(51) Int. Cl.
| | | |
|---|---|---|
| *G03B 17/55* | (2021.01) | |
| *H04N 23/51* | (2023.01) | |
| *H05K 7/20* | (2006.01) | |
| *B60R 11/00* | (2006.01) | |

(52) U.S. Cl.
CPC ....... *H05K 7/20136* (2013.01); *H05K 7/2039* (2013.01); *B60R 2011/0026* (2013.01); *B60R 2011/0094* (2013.01)

(58) Field of Classification Search
USPC ........................................................ 348/148
See application file for complete search history.

(56) References Cited

U.S. PATENT DOCUMENTS

| | | | |
|---|---|---|---|
| 7,038,577 | B2 | 5/2006 | Pawlicki et al. |
| 7,480,149 | B2 | 1/2009 | DeWard et al. |
| 7,720,580 | B2 | 5/2010 | Higgins-Luthman |
| 7,855,755 | B2 | 12/2010 | Weller et al. |
| 8,256,821 | B2 | 9/2012 | Lawlor et al. |
| 9,487,159 | B2 | 11/2016 | Achenbach |
| 9,596,387 | B2 | 3/2017 | Achenbach et al. |
| 9,871,971 | B2 | 1/2018 | Wang et al. |
| 9,896,039 | B2 | 2/2018 | Achenbach et al. |
| 10,104,808 | B2 | 10/2018 | Scharinger et al. |
| 12,120,408 | B2 | 10/2024 | Solar |
| 2002/0126453 | A1 | 9/2002 | Ubukata |
| 2014/0055667 | A1* | 2/2014 | Kawamura ............ G02B 7/028 |
| | | | 348/373 |
| 2015/0342091 | A1* | 11/2015 | Scharinger ......... H05K 7/20418 |
| | | | 165/80.3 |
| 2016/0227079 | A1* | 8/2016 | Oh ......................... H04N 23/45 |
| 2017/0064175 | A1* | 3/2017 | Furutake .................. G02B 3/02 |
| 2017/0064877 | A1* | 3/2017 | Ratcliffe ............... H04N 23/51 |
| 2017/0070652 | A1 | 3/2017 | Muller |
| 2017/0113611 | A1* | 4/2017 | Thompson ............. H04N 13/25 |
| 2017/0129404 | A1* | 5/2017 | Oda ....................... G03B 17/02 |
| 2017/0131621 | A1* | 5/2017 | Tang .................... G03B 17/561 |
| 2017/0182944 | A1* | 6/2017 | Achenbach ............ B60K 35/60 |
| 2017/0184945 | A1* | 6/2017 | Carlson .................. G03B 17/02 |
| 2018/0228050 | A1* | 8/2018 | Chien ............... H05K 7/20172 |
| 2019/0124238 | A1 | 4/2019 | Byrne et al. |
| 2019/0124243 | A1 | 4/2019 | Mleczko et al. |
| 2019/0128589 | A1* | 5/2019 | Adams ...................... F25D 3/08 |
| 2019/0306966 | A1 | 10/2019 | Byrne et al. |
| 2020/0148137 | A1 | 5/2020 | Cordeiro |
| 2020/0154020 | A1 | 5/2020 | Byrne et al. |
| 2020/0279129 | A1* | 9/2020 | Batchelor ............. G06V 10/82 |

* cited by examiner

124

122

124a

132

134

115

126

Foam pad

130

118e   118f

118

120

Screws

118c

VEHICULAR FORWARD CAMERA MODULE WITH COOLING FAN

CROSS REFERENCE TO RELATED APPLICATIONS

The present application is a continuation of U.S. patent application Ser. No. 17/303,962, filed Jun. 11, 2021, now U.S. Pat. No. 12,120,408, which claims the filing benefits of U.S. provisional patent application Ser. No. 62/705,113, filed Jun. 11, 2020, which is hereby incorporated herein by reference in its entirety. U.S. patent application Ser. No. 17/303,962 also is a continuation-in-part of U.S. patent application Ser. No. 16/968,177, filed Aug. 7, 2020, now U.S. Pat. No. 11,290,622, which is a 371 national stage entry of PCT Application No. PCT/US2020/015306, filed Jan. 28, 2020, which claims the filing benefits of U.S. provisional application Ser. No. 62/797,469, filed Jan. 28, 2019, which are hereby incorporated herein by reference in their entireties.

FIELD OF THE INVENTION

The present invention relates generally to a vehicle vision system for a vehicle and, more particularly, to a vehicle vision system that utilizes a windshield mounted forward viewing camera at a vehicle.

BACKGROUND OF THE INVENTION

Use of imaging sensors in vehicle imaging systems is common and known. Examples of such known systems are described in U.S. Pat. Nos. 9,896,039; 9,871,971; 9,596,387 and/or 9,487,159, which are hereby incorporated herein by reference in their entireties. Heat is generated during operation of the cameras, and heat dissipating fins or the like are typically used to dissipate heat.

SUMMARY OF THE INVENTION

The present invention provides a driver assistance system or vision system or imaging system for a vehicle that utilizes a windshield mounted forward viewing camera module having a camera that captures image data representative of images of scenes exterior of the vehicle, and provides a cooling fan assembly that is integrated in the camera module to force cooling air over one or more parts of the camera module to enhance cooling of the camera module during operation of the camera.

These and other objects, advantages, purposes and features of the present invention will become apparent upon review of the following specification in conjunction with the drawings.

DESCRIPTION OF THE PREFERRED EMBODIMENTS

A vehicle vision system and/or driver assist system and/or object detection system and/or alert system operates to capture images exterior of the vehicle and may process the captured image data to display images and to detect objects at or near the vehicle and in the predicted path of the vehicle, such as to assist a driver of the vehicle in maneuvering the vehicle in a rearward direction. The vision system includes an image processor or image processing system that is operable to receive image data from one or more cameras and provide an output to a display device for displaying images representative of the captured image data. Optionally, the vision system may provide display, such as a rearview display or a top down or bird's eye or surround view display or the like.

Figure 1:
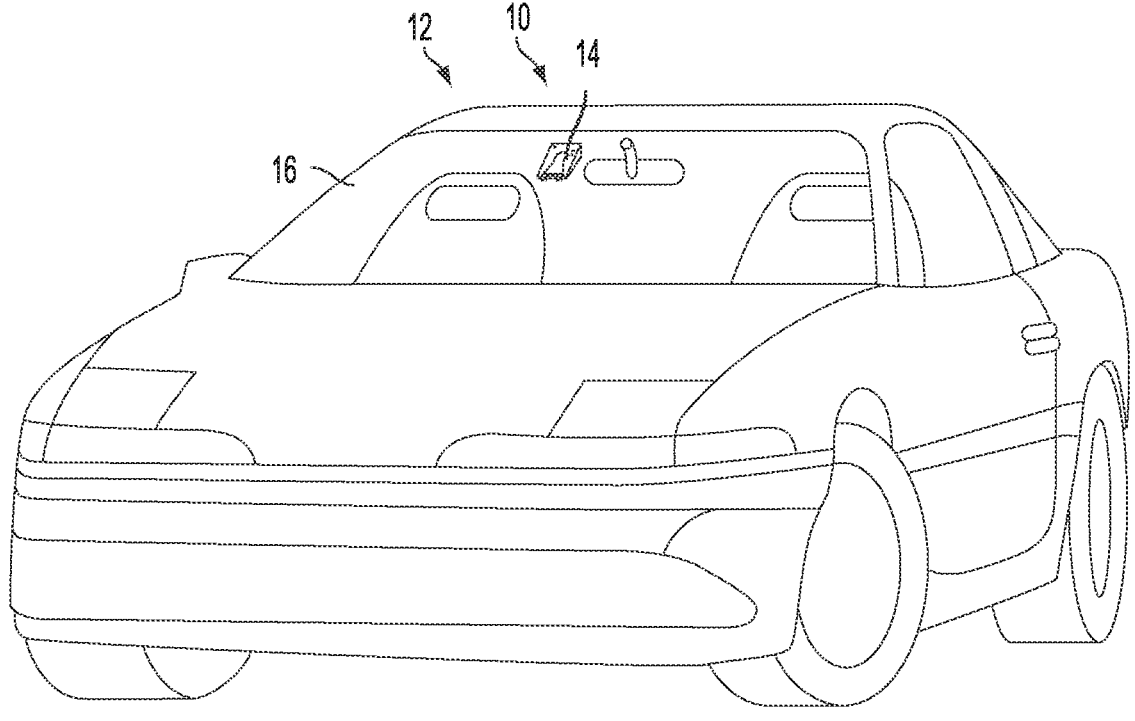
FIG. 1 is a perspective view of a vehicle with a vision system that incorporates a windshield mounted forward viewing camera module.

Referring now to the drawings and the illustrative embodiments depicted therein, a vision system 10 for a vehicle 12 includes at least one exterior viewing imaging sensor or camera 14, such as a forward viewing imaging sensor or camera, which may be disposed at and behind the windshield 16 of the vehicle and viewing forward through the windshield so as to capture image data representative of the scene occurring forward of the vehicle (FIG. 1). Optionally, the system may include multiple exterior viewing imaging sensors or cameras, such as a forward viewing camera at the front of the vehicle, and a sideward/rearward viewing camera at respective sides of the vehicle, and a rearward viewing camera at the rear of the vehicle, which capture images exterior of the vehicle. The camera or cameras each include a lens for focusing images at or onto an imaging array or imaging plane or imager of the camera. Optionally, the forward viewing camera may be disposed at the windshield of the vehicle and view through the windshield and forward of the vehicle, such as for a machine vision system (such as for traffic sign recognition, headlamp control, pedestrian detection, collision avoidance, lane marker detection and/or the like). The vision system 10 includes a control or electronic control unit (ECU) or processor that is operable to process image data captured by the camera or cameras and may detect objects or the like and/or provide displayed images at a display device for viewing by the driver of the vehicle. The data transfer or signal communication from the camera to the ECU may comprise any suitable data or communication link, such as a vehicle network bus or the like of the equipped vehicle.

Heat is generated during operation of the camera, such that, without enhanced cooling, maximum operating temperatures at the camera and/or associated electronics may be exceeded. For instance, the imager semiconductor junction temperature has to be below a threshold temperature to ensure necessary image quality. The camera module 14 includes an integrated active cooling fan assembly 18 that is attached at the lower outside surface of the lower housing cover 20 and that operates to force air over and around the camera module's body or housing to enhance cooling of the camera during operation.

Figures 2, 3:
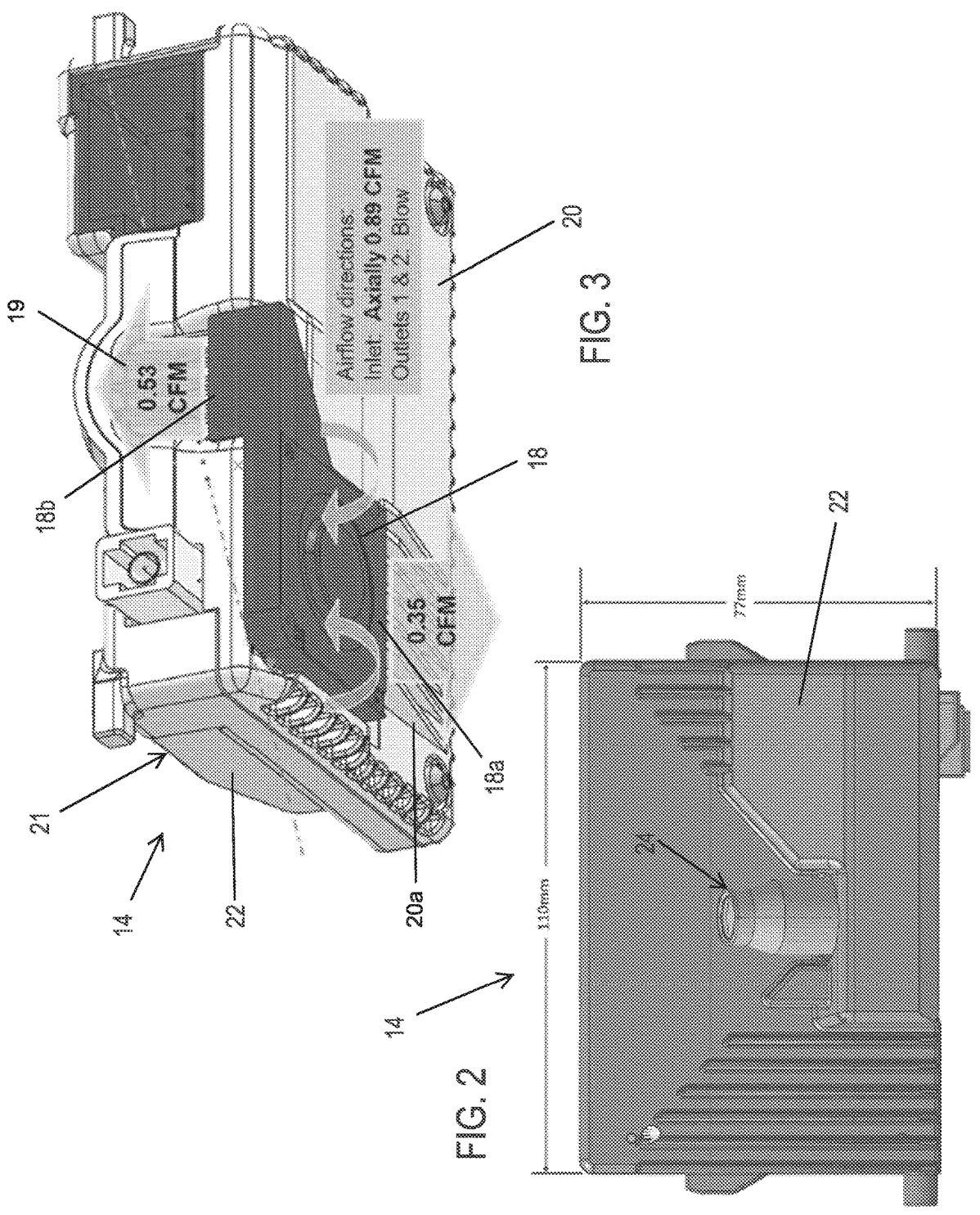
FIG. 2 is a top plan view of the camera module.
FIG. 3 is a rear perspective view of the camera module, showing the integrated cooling fan assembly at an underside of the camera module.
Figure 5:
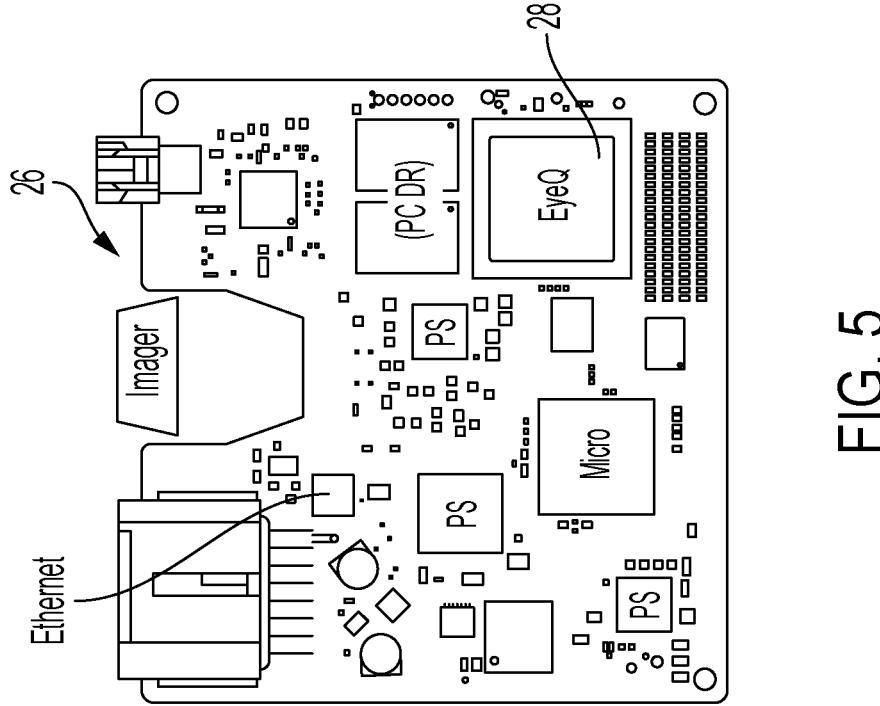
FIG. 5 is a top plan view of the circuit board of the camera module.

In the illustrated embodiment, the camera module 14 includes a housing 21 (e.g., a metal or metallic housing or a plastic housing) comprising an upper housing portion 22 (e.g., a metal or metallic upper housing portion or a plastic upper housing portion) and the lower housing portion 20 (e.g., a metal or metallic lower housing portion or a plastic lower housing portion), with a camera 24 partially disposed in the housing. The camera 24 comprises an imager circuit board having an imager thereat, and further comprises a lens barrel (accommodating a lens) that protrudes through an aperture of the upper housing portion (as shown in FIG. 2). The camera module includes a main or principle or primary circuit board 26 (as shown in FIG. 5) disposed in the housing, with the primary circuit board comprising an image processor 28 that processes image data captured by the camera (with the imager circuit board being electrically connected to the main circuit board via a flexible connector, such as a flexible ribbon cable or the like, whereby image data captured by the camera is provided to the primary or main circuit board via the flexible connector). Because of the amount of heat typically generated by the circuitry of the circuit boards during operation of the camera (and particularly the heat generated by the image processor of the primary circuit board during operation of the camera), the cooling fan assembly is disposed at the lower housing portion such that, when an electrically powered motor of the cooling fan assembly is electrically powered, the electrically powered motor rotatably drives a plurality of fan blades about an axis of rotation such that the cooling fan directs airflow onto and along heat dissipating fins of the camera housing, such as at an exterior side of the lower housing portion. The heat dissipating fins are at least in part present at an outer-side location at the outer side of the lower housing portion that coincides with or is juxtaposed with the inner-side location of a thermal element (such as a thermally conductive paste or grease or the like) that thermally conductively connects the image processor with the inner side of the lower housing portion. Thus, the image processor is in thermally conductive connection with the heat dissipating fins via the thermal element and a wall thickness (of the lower wall or structure) of the lower housing portion at the location where the thermal element is disposed.

For example, the cooling fan assembly 18 includes a first exit duct 18a that, when the motor of the cooling fan assembly is electrically powered, directs airflow between and along heat dissipating fins 20a (FIGS. 3 and 4) at the lower housing portion 20 that are at or near or thermally conductively connected to the processor 28. The thermal element or paste or grease may interface or thermally conductively connect the image processor with the inner or upper surface or side of the lower housing portion and thus with the heat dissipating fins 20a at the exterior or outer lower surface or side of the lower housing portion to enhance heat transfer from the processor. The cooling fan assembly comprises a low profile cooling fan assembly that does not protrude beyond the height of the heat dissipating fins at the outer side of the lower housing portion. The first exit duct 18a directs air at an end of and in a direction generally parallel to the heat dissipating fins 20a, such that the air moves along channels between adjacent fins to enhance cooling of the fins and thus of the camera module.

The cooling fan assembly also includes a second exit duct 18b (FIG. 3) that, when the motor of the cooling fan assembly is electrically powered, directs airflow between and along rear heat dissipating fins 19 (FIGS. 3 and 4) at an outer side of a rear portion of the housing 21 (such as at a rear part of the upper housing portion and/or a rear part of the lower housing portion) that are at or near or thermally conductively connected to the imager circuit board. For example, a thermal element or paste or grease may interface or thermally conductively connect the imager circuit board and the imager with the rear portion of the housing such as an inner surface or side of the rear portion of the housing and thus with the heat dissipating fins 19 (which are at least in part present at an outer-side location at the outer side of the rear housing portion that coincides with or is juxtaposed with the inner-side location of the thermal element that thermally conductively connects the imager circuit board with the interior side of the rear housing portion) to enhance heat transfer from the imager circuit board. Thus, the imager circuit board is in thermally conductive connection with the rear heat dissipating fins via the thermal element and a wall thickness (of the lower wall or structure) of the rear portion of the housing at the location where the thermal element is disposed. The second exit duct 18b directs air at an end of and in a direction generally parallel to the heat dissipating fins 19, such that the air moves along channels between adjacent fins to enhance cooling of the fins and thus of the camera module.

Figure 4:
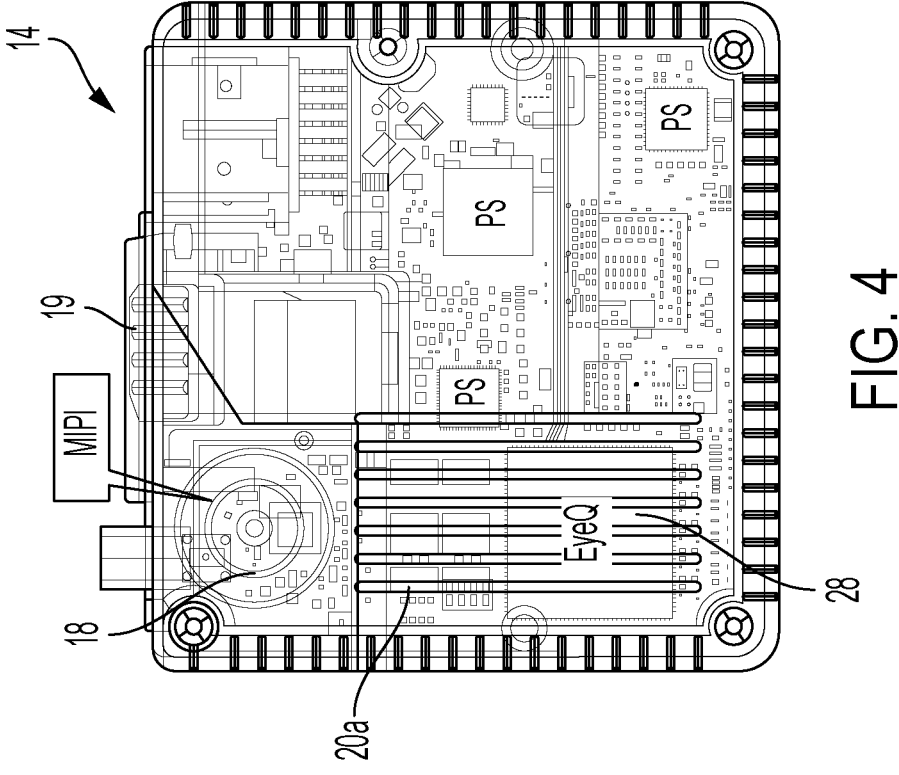
FIG. 4 is a bottom plan view of the camera module, with the housing shown in phantom to show interior details of the camera module.

As shown in FIGS. 2-4, the cooling fan assembly 18 comprises a low profile device that is integrated with the camera module. As shown, the cooling fan assembly is attached at the lower side or outer surface of the lower housing 20 of the camera module 14. The cooling fan assembly draws air in at its lower side (such as at one or more inlet vents or openings at the lower part of the cooling fan assembly) and forces air through one or more exit ports or ducts toward targeted regions of the camera module to enhance or optimize cooling of the camera module (with the targeted regions optionally having heat dissipating fins or structure to further enhance or optimize the cooling of the camera module).

In the illustrated embodiment, the first exit port or duct 18a (FIG. 6) of the cooling fan assembly directs airflow onto and along heat dissipating fins of the camera module that are at or near or in contact with the processor 28 at the main circuit board 26 of the camera module. Thus, the cooling fan provides enhanced cooling of the heat dissipating fins of the camera module to enhance the dissipation of heat generated by the processor during operation of the camera.

Figures 6, 7:
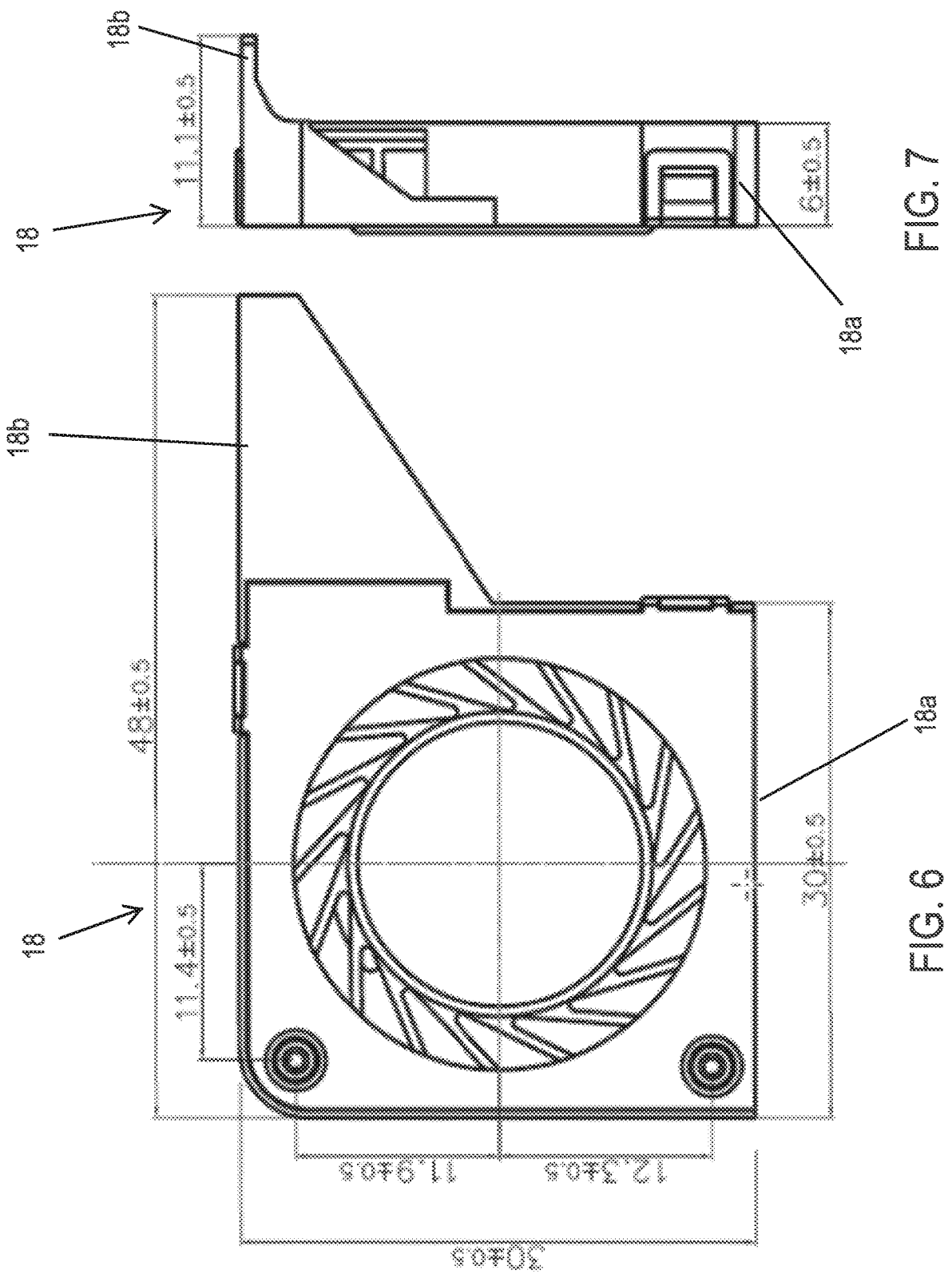
FIG. 6 is a plan view of the cooling fan assembly.
FIG. 7 is a side elevation of the cooling fan assembly.
Figure 8:
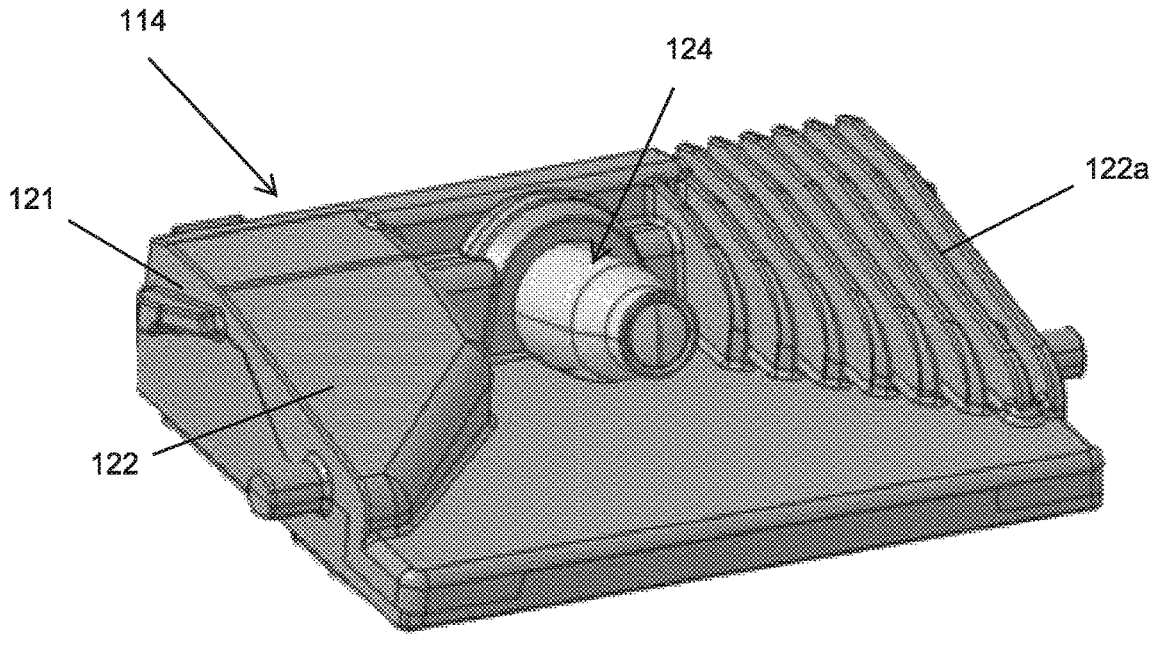
FIG. 8 is an upper perspective view of another camera module.

The second exit port or duct 18b of the cooling fan assembly directs airflow onto and along the rear surface of the camera module to cool the imager and imager circuit board of the camera 26 disposed at the housing. For example, heat dissipating fins may be provided at the rear of the camera housing at or near or in thermal conductive contact with the imager circuit board or elements thereof. The cooling fan duct 18b directs airflow onto/into and along the heat dissipating fins of the camera module to enhance the dissipation of heat generated by the imager and camera circuitry during operation of the camera. As shown in FIGS. 3 and 7, the second exit port or duct 18b directs the air 90 degrees (or other suitable angle, such as an angle greater than 45 degrees, to accommodate the shape or curvature of the camera housing) from along the bottom of the camera housing to along the rear of the camera housing (such as at a rear part of the upper housing portion and/or a rear part of the lower housing portion).

The cooling fan assembly comprises a self-contained unit or module that includes the motor, fan blades and housing and exit ducts, whereby the cooling fan assembly is mounted at the lower housing portion of the camera module as a unit. The size and shape of the cooling fan assembly is selected based at least in part on the size and shape of the camera module housing and the location and configuration of the heat dissipating fins. For example, the length of the camera module is preferably less than 100 mm, more preferably less than 80 mm, and more preferably less than 60 mm (shown, for example, as 77 mm in FIG. 2), while the width of the camera module is preferably less than 125 mm, more preferably less than 115 mm, and more preferably less than 105 mm (shown, for example, as 110 mm in FIG. 2). The fan assembly may have a width and length of less than 45 mm, preferably less than 30 mm, such as less than 25 mm (shown, for example, with a width of 30 mm in FIG. 6). The fan assembly may comprise a low profile fan assembly having a thickness that is preferably less than 12 mm, more preferably less than 7.5 mm, such as less than 5 mm (shown, for example, with a thickness of 6 mm in FIG. 7). The air flow generated or output by the fan assembly may be at a flow rate at least 0.7 cubic feet per minute (CFM), with the lower exit port (that directs air flow along and between the lower heat dissipating fins) output air at a flow rate of at least 0.2 CFM, preferably at least 0.3 CFM, and more preferably at least 0.5 CFM (such as, for example, 0.35 CFM as shown in FIG. 3), and with the rear exit port (that directs air flow along and between the rear heat dissipating fins) output air at a flow rate of at least 0.5 CFM, preferably at least 0.6 CFM, and more preferably at least 0.6 CFM (such as, for example, 0.53 CFM as shown in FIG. 3). The design and configuration of the cooling fan assembly can be adapted to provide desired flow rates at and along and between the respective heat dissipating fins.

As shown in FIG. 3, the exit ports 18a, 18b of the cooling fan assembly have their openings at an entrance to the respective heat dissipating fins, such that the air that is radially exiting the fan at the ports flows into and along and between the heat dissipating fins. In the illustrated embodiment, the heat dissipating fins are generally the same length and terminate along a generally linear outlet port. However, the fins may be different lengths, with the ends of the heat dissipating fins forming a curve or other shape that generally corresponds to a curve or shape of the respective outlet port of the cooling fan assembly.

In the illustrated embodiment of FIGS. 2, 3, 6 and 7, the cooling fan assembly is configured to direct air radially out from the fan blades so that air is directed into passageways or flow paths defined at least in part by the heat dissipating fins and that receive the air flow at locations that are radially outboard from the fan blades. Optionally, however, the cooling fan assembly may be configured to direct air axially into or onto cooling fins or air flow paths.

For example, and such as shown in FIGS. 8-11, a camera module 114 includes a housing 121 comprising an upper housing portion or cover 122 (e.g., a metal upper housing portion or cover or a plastic upper housing portion) and a lower housing portion or cover 120 (e.g., a metal lower housing portion or cover or a plastic lower housing portion), with a camera 124 partially disposed in the housing. The camera module 114 includes a main or principle or primary circuit board 126 disposed in the housing, with the primary circuit board comprising an image processor that processes image data captured by the camera (with the image data captured by the camera being provided to the primary circuit board via a flexible connector, such as a flexible ribbon cable or the like). As can be seen with reference to FIG. 11, the lens barrel of the camera 124 is non-parallel to and forms an acute upward angle with the plane of the primary circuit board 126. The camera module further includes an integrated active cooling fan assembly 118 that is attached at the lower outside surface of the lower housing portion 120 and that operates (via electrical powering of a motor 118a of the cooling fan assembly that rotatably drives a plurality of fan blades 118b) to force air toward the camera module's body or housing to enhance cooling of the camera during operation.

Figure 9:
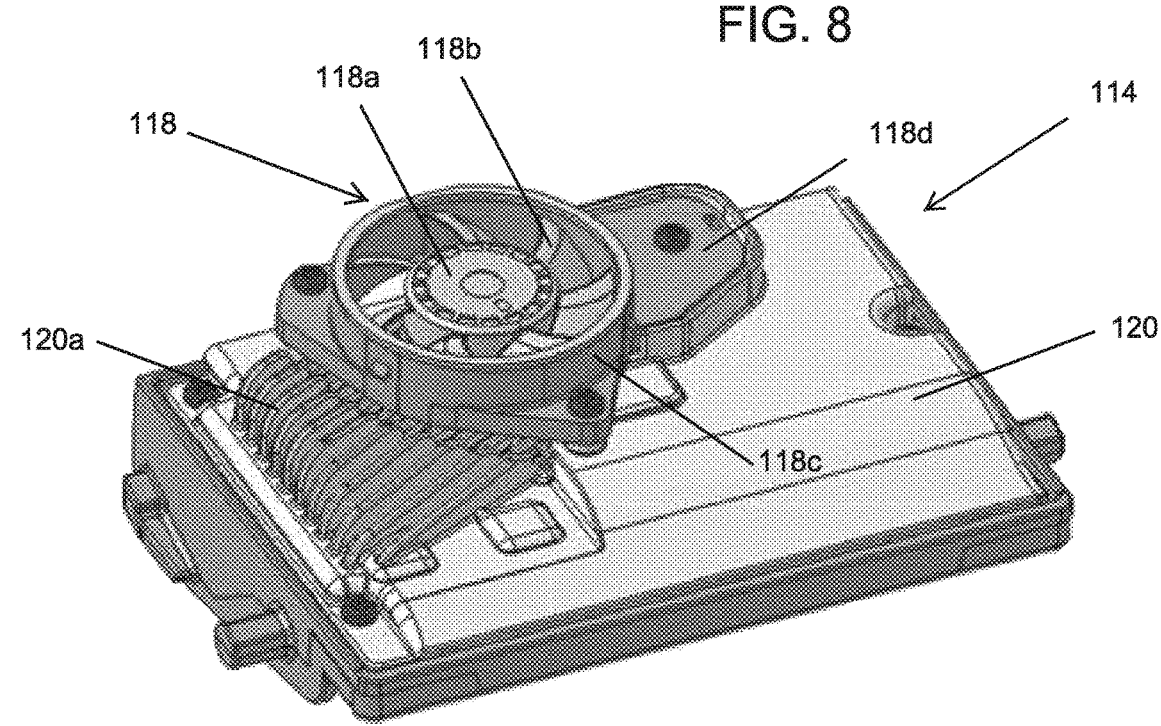
FIG. 9 is a lower perspective view of the camera module of FIG. 8.

Referring to FIG. 9, the cooling fan assembly 118, when the motor is operated, directs air flow axially (in a direction parallel to the axis of rotation of the fan blade) toward the lower surface of the camera housing or lower housing cover 120, where the air may flow along heat dissipating fins 120a at the lower housing portion 120 (such as along and within channels defined between adjacent fins) that are at or near or thermally conductively connected to the processor so as to enhance cooling of the camera module during operation. A thermal element 130 (such as a thermally conductive paste or grease or the like) may interface or thermally conductively connect the image processor at the primary circuit board 126 with the inner or upper side or surface of the lower housing portion 120 and thus with the heat dissipating fins 120a of the lower housing portion 120 to enhance heat transfer from the processor. The heat dissipating fins 120a are at least in part present at an outer-side location at the outer side of the lower housing portion 120 that coincides with or is juxtaposed with the inner-side location of the thermal element 130 that thermally conductively connects the image processor with the inner side of the lower housing portion.

The cooling fan assembly 118 may also direct air flow into a passageway along the rear of the camera housing (such as along and within channels defined between adjacent fins of the heat dissipating fins 119 at a rear portion of the housing, such as at a rear part of the upper housing portion and/or a rear part of the lower housing portion) that are at or near or thermally conductively connected to the imager circuit board. Another thermal element 132 (such as a thermally conductive paste or grease or the like) may interface or thermally conductively connect the imager circuit board 124a of the camera 124 with an inner surface or side of the rear housing portion and thus with the heat dissipating fins 119 of the housing to enhance heat transfer from the imager circuit board. The rear heat dissipating fins 119 are at least in part present at an outer-side location at the outer side of the rear portion of the housing that coincides with or is juxtaposed with the inner-side location of where the thermal element 132 thermally conductively connects the imager circuit board with the inner side of the rear portion of the housing.

The air flow path and/or heat dissipating fins may be connected with or aligned or thermally connected to heat dissipating fins 122a at the upper housing portion 122 to further enhance cooling of the camera module. Optionally, a thermal element 134 (such as a thermally conductive paste or grease or the like) may interface or thermally conductively connect circuitry or components of the primary circuit board 126 to a lower or inner surface or side of the upper housing portion 122.

Figure 10:
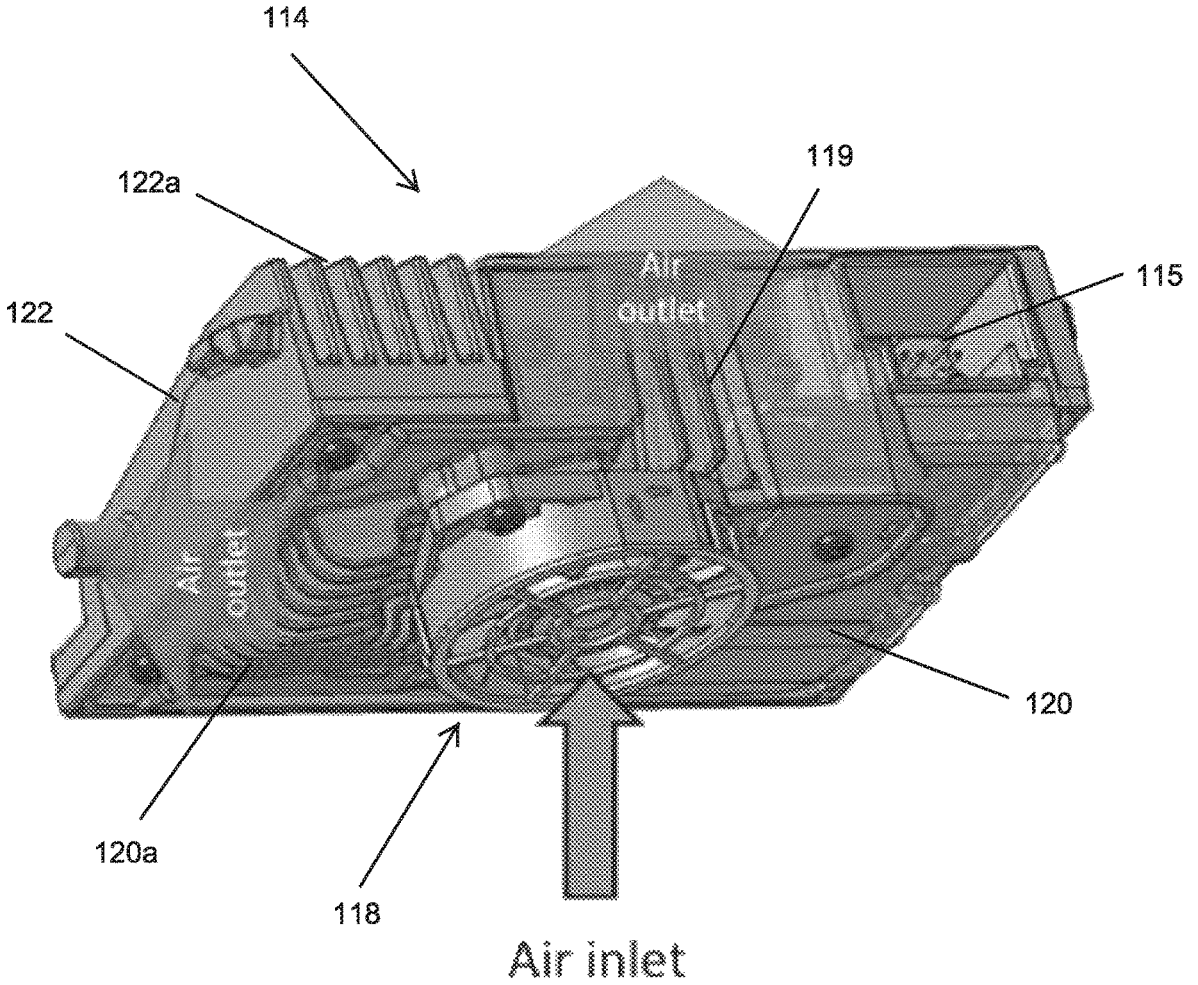
FIG. 10 is a rear perspective view of the camera module of FIG. 8.
Figure 11:
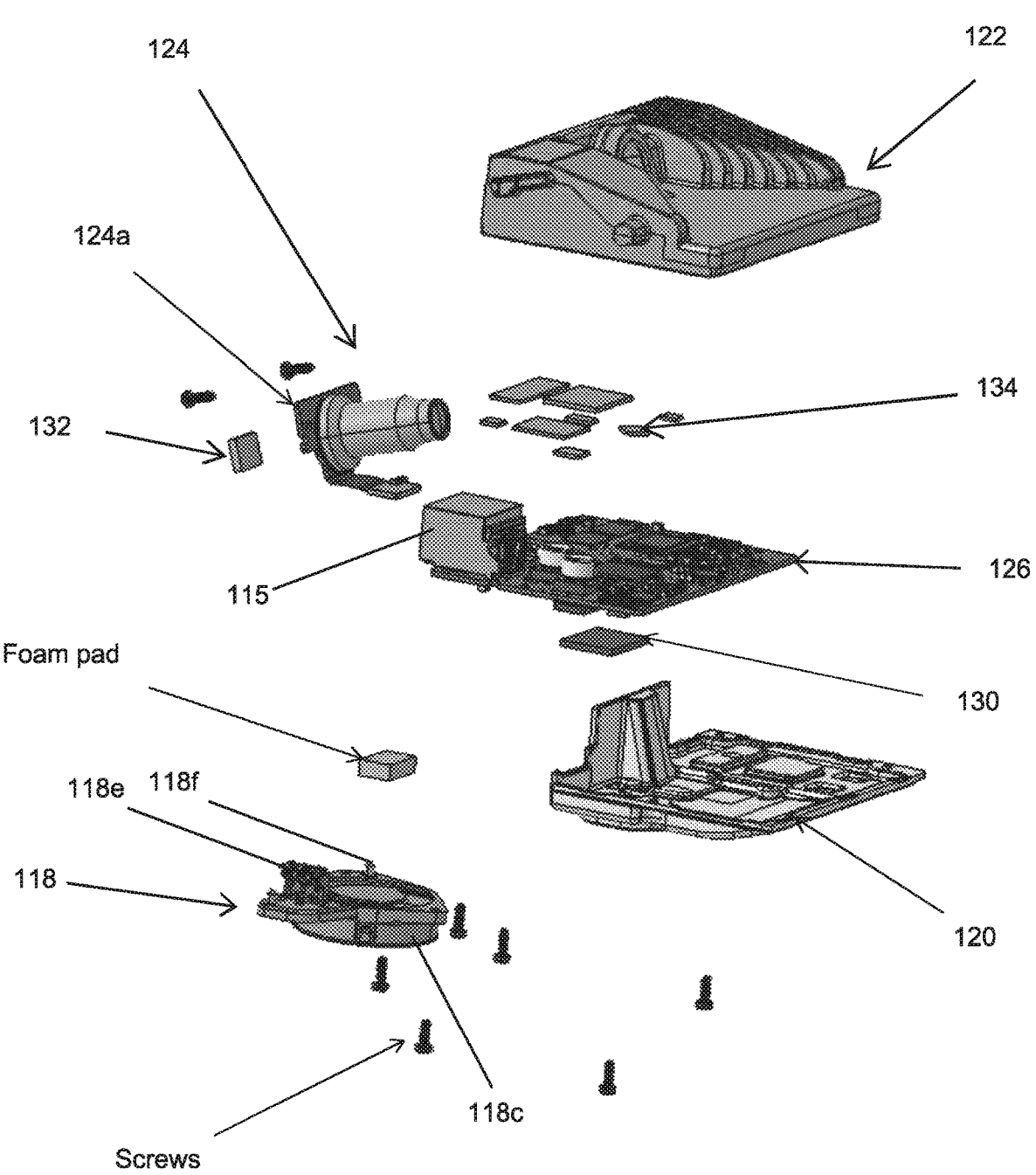
FIG. 11 is an exploded view of the camera module of FIG. 8.

As shown in FIGS. 9 and 10, the cooling fan assembly has a housing portion 118c that circumscribes the fan blades 118b and includes attachment structure or flanges for attaching the cooling fan assembly at the lower housing portion of the camera module. The cooling fan housing portion 118c has an air inlet end and an air outlet or exit end, with its output or exit end (the end of the fan structure that faces the camera housing) at entrances to the respective heat dissipating fins, such that the air axially exiting the fan flows towards the lower camera housing and is diverted along and between the heat dissipating fins. In the illustrated embodiment, the lower heat dissipating fins 120a are formed with shallower fin portions (fin portions that protrude a lesser amount from the outer surface of the lower housing portion than deeper fin portions) at the ends where the cooling fan assembly is mounted, such that air output by the fan flows into and along and between the heat dissipating fins along the lower housing portion (and between the output of the fan and the outer surface of the lower housing portion). Likewise, the rear heat dissipating fins 119 are formed with fin portions at the lower outer surface of the lower housing portion that are generally the same depth as the shallower fin portions of the lower heat dissipating fins, such that air output by the fan flows into and along and between the heat dissipating fins along the lower housing portion (and between the output of the fan and the outer surface of the lower housing portion) and into and along and between the rear heat dissipating fins at the rear portion of the housing.

The shallower fin portions of the lower heat dissipating fins and the lower portions of the rear dissipating fins may be configured so that their lower edges are generally co-planar such that the cooling fan assembly mounts to the lower housing portion with the output area of the fan at the generally planar construction provided by the fin portions. As can be seen with reference to FIGS. 9 and 10, the cooling fan assembly attaches to the lower housing portion via a plurality of fasteners (such as, for example, three threaded fasteners or screws that are threaded into threaded bores or apertures at the lower housing portion), with air flow from the cooling fan (when the motor is electrically operated) being directed along and between the heat dissipating fins 119, 120a, and not elsewhere (e.g., the areas where the fins 119 or 120a are not located are sealed or blocked so that air flow generated by the fan does not escape and is instead used to cool the heat dissipating fins and the camera module.

The deeper fin portions of the lower heat dissipating fins 120a (that protrude a greater amount from the outer surface of the lower housing portion than shallower fin portions) are configured to provide enhanced cooling of the camera module and may be of different lengths along the outer surface so that the ends of the deeper portions of the fins form a curvature or shape that generally corresponds with the curvature or shape of the cooling fan assembly. The output end of the fan assembly thus is disposed over an end or entry portion of the lower heat dissipating fins (at the shallower fin portions) and over an end or entry portion of the rear heat dissipating fins (with the axially flowing air flowing in a direction along the rear heat dissipating fins along the rear portion of the housing), so that the air flow that is axially output by the fan flows into and along and between the respective heat dissipating fins.

Optionally, the lower housing portion may be constructed with diverting fins or structure that diverts a desired amount or portion of the output air flow into and along and between the respective heat dissipating fins. For example, the diverting construction may be centrally located at the output end of the fan to divert generally equal parts of the output air flow to each set of heat dissipating fins, or the diverting construction may be more towards the rear heat dissipating fins so as to divert more of the output air flow into and along the lower heat dissipating fins, so as to provide enhanced cooling of heat generated by the imager processor during operation of the camera module.

The cooling fan assembly includes a connecting portion 118d that attaches at the lower surface of the lower housing portion 120, and that may provide for electrical connection (such as via a multi-pin connector 118e (FIG. 11) that plugs into or otherwise electrically connects to corresponding pins or terminals of or at the primary circuit board) to circuitry of the camera module when the cooling fan assembly is mounted or attached at the lower housing portion of the camera module. The cooling fan assembly may also include alignment pins or structure 118f (FIG. 11) to align the cooling fan with the camera connector and with the mounting structure as the cooling fan assembly is moved into place at the lower housing portion of the camera module. Thus, when the camera module is installed in the vehicle and electrically connected to the vehicle power source (such as via a multi-pin connector 115 of the camera module electrically connecting to a plug or socket connector of a vehicle wire harness), the cooling fan motor 118a is electrically controlled or powered or operated to cool the camera module during operation of the camera module, such as when temperature at the camera module exceeds a threshold level, such as discussed below.

The cooling fan assembly 118 comprises a self-contained unit or module that includes the motor, fan blades and housing, whereby the cooling fan assembly is mounted at the lower housing portion of the camera module as a unit. The cooling fan housing circumscribes the fan blades and motor (providing a cylindrical air passageway from an inlet end of the cooling fan to an outlet end of the cooling fan) and provides mounting structure for attaching the cooling fan assembly at the lower housing portion of the camera module).

The cooling fan assembly is thus attached (such as via two or more threaded fasteners or other external connection) at the camera module so that it can be removed and replaced or serviced without need for replacing the front camera module. The cooling fan assembly and the camera module may be configured such that electrical connection of the motor of the cooling fan assembly is made to circuitry of the camera module when the cooling fan assembly is attached at the lower housing portion. For example, electrical leads from the circuit board or electrical connector of the camera module may have terminals or contacts at the lower housing portion where the cooling fan assembly is mounted, such that electrical connection to the cooling fan assembly is made when the fan is attached or mounted at the lower housing portion. The electrical connection may provide electrical power and/or control to the motor of the cooling fan assembly via the circuitry of the camera module when the camera module is electrically connected to the vehicle power source (such as via a wire harness or the like). The lower housing portion of the camera module may include a socket or recess for receiving a portion of the integrated cooling fan assembly in its mounted or attached position. Optionally, the lower housing portion may include guide pins or the like for accurately positioning the cooling fan assembly (e.g., with respect to the terminals or contacts at the lower housing portion) as the cooling fan assembly is positioned at and attached or mounted at the lower housing portion.

The cooling fan assembly may comprise a DC brushless motor with a 5V operating voltage, and may be pulse-width modulation (PWM) controlled. The cooling fan assembly may have a starting voltage of around 4 VDC and may have an operating current of 183 mA and a rated power consumption of 0.92 Watts. The cooling fan assembly, when the motor is electrically powered, may generate up to around 1.18 CFM airflow (or more) when operating in the range of around 6,300 RPM to around 11,700 RPM (9000 RPM+/−30 percent). The operating temperature range may be around 0 degrees C. to around 85 degrees C., with a storage temperature range of around-40 degrees C. to around 90 degrees C. In a situation where the fan is locked by an external force while being electrically powered, an increase in coil temperature of the motor is prevented by temporarily turning off the electrical power to the fan motor. The fan may automatically restart when the locked rotor condition is released.

The camera housing includes vent openings and the cooling fan assembly includes channels or ducts that direct air flow (generated when the fan motor is electrically powered) at cooling fins or components of the camera module to optimize airflow of the fan as well as to support natural convection around the camera module. With respect to the cooling fan assembly 118, the intake opening is at the end of the cooling fan assembly distal from the end of the assembly that interfaces with or attaches at the lower housing portion of the camera module, and thus allows for greater air intake when the motor is powered to drive/rotate the fan blades. Optionally, the housing of the cooling fan assembly may include structure (see FIG. 10) over the motor and fan blades to prevent contact of the fan blades, such as during assembly and installation of the camera module.

Figure 12:
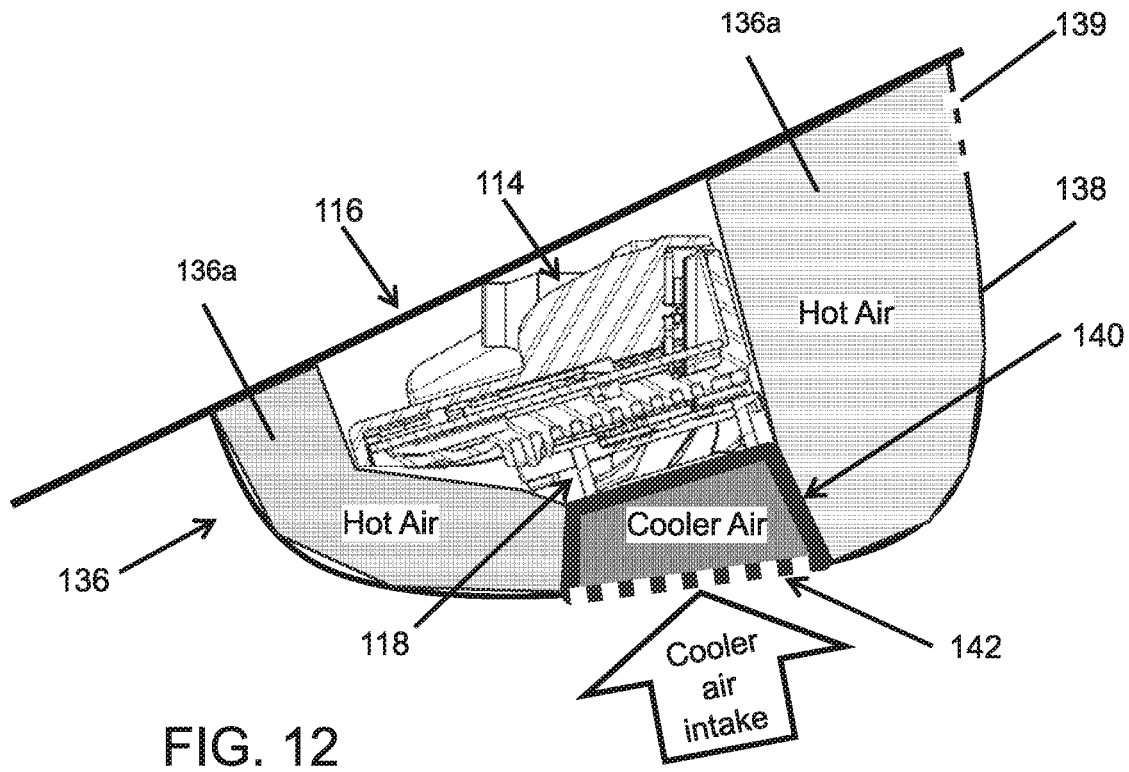
FIG. 12 is a sectional view of the camera module, disposed at a windshield of a vehicle and within a cover element.

With reference to FIG. 12, the camera module 114 may be disposed at and behind a windshield 116 of a vehicle so as to view through the windshield and forward of the vehicle. The camera module 114 is disposed in a housing or windshield electronics module 136 having a cover element or beauty cover 138 that houses the camera module (and optionally other accessories) and conceals the camera module from view by a person within the vehicle. The cover element may comprise a plastic cover element or a metal cover element. The cover element 138 may attach at or to the camera module or at or to the in-cabin side of the windshield or at or to a mounting structure attached at the in-cabin side of the windshield. A perimeter edge region of the cover element (which may include a compressible gasket or foam or rubber material) may engage or may be pressed against the in-cabin side of windshield when the cover element is disposed at the camera module. The module 136 has an interior cavity 136a (in which the camera module 114 is disposed), where the air may be heated during operation of the camera and/or due to higher environment temperatures. The module 136 comprises an air duct 140 that is disposed between the cooling fan 118 and an air inlet 142 at the cover element 138.

The air duct 140 provides a channel or conduit between the air inlet 142 and the intake or inlet of the fan 118 and is at least in part isolated from the rest of the cavity 136a of the module where heated air may be present. Thus, during operation of the camera module and during operation of the cooling fan 118, the fan 118 draws cooler air from the air duct 140 and from exterior the module 136 (via the air inlet 142) to further enhance cooling of the camera module.

The air duct 140 comprises a conduit, such as a cylindrical wall or structure that provides a passageway between the air inlet 142 and the cooling fan air intake. Optionally, the cooling fan may be disposed at the air inlet at the cover element and the air duct may provide a conduit or passageway between the cooling fan and the camera module. In such an embodiment, the fan assembly may be attached at or in the wall of the cover element and operate to draw air through the cover element and provide air flow through the air duct to the heat dissipating fins at the camera housing.

The wall or structure of the air duct may comprise a material with reduced thermal conduction to reduce heating of the structure by the heated air within the housing or cover 138. The air inlet 142 may comprise a plurality of vents or apertures or slots formed at the cover 138 so that cooler air exterior of the housing is drawn through the cover or housing via the vents and is drawn along the passageway formed by the structure of the air duct 140 and into the fan intake for cooling the camera module. The cover 138 may include additional vents or exhaust apertures or slots 139 for exhausting the air that is output by the fan and that is blown over the heat dissipating fins and into the cavity defined by the cover and windshield. The exhaust ports are separate from and spaced from the air inlet 142 and may be disposed at an upper region of the cover 138 to enhance exhausting of the heated air from inside the cover element.

The camera module may be mounted or attached at a bracket that is adhesively attached at the in-cabin side of the vehicle windshield, and the cover element may also be attached at the bracket or attached at a frame or other bracket that is adhesively attached at the in-cabin side of the vehicle windshield. The cover element, camera module and bracket or brackets comprise a windshield electronics module that houses the camera module and that may also house one or more other electronic accessories (e.g., a rain sensor and/or the like) at the in-cabin side of the vehicle windshield.

The air duct or conduit provides air intake from exterior the windshield electronics module to the fan at the camera such that the fan does not draw heated air from within the windshield electronics module. The air duct or conduit thus provides enhanced cooling of the camera by providing cooler intake air to the fan (as compared to the heated air that is typically present within the cavity of the windshield electronics module). The fan, when operated, draws air from the air inlet at the cover and through the air duct or conduit and out onto and along or across the heat dissipating fins of the camera housing and into the cavity defined by the cover and windshield, whereby the air may be vented to exterior the cover via exhaust vents or ports that are separate from and spaced from the air inlet at the air duct or conduit. In the illustrated embodiment, the fan is disposed at a lower side of the camera module and the air intake conduit extends downward from the fan to the air inlet at a lower part of the cover. The exhaust ports then may be established at an upper part of the cover and substantially spaced from and above the air inlets to limit the heated air that is exhausted from the module from being drawn in through the air inlet to the fan.

Therefore, the axial or radial cooling fan is mounted at the bottom or side of the forward viewing camera and operates or functions to draw cooler air from the passenger cabin via the air duct and to force the air onto the camera surface. To optimize the cooler air taken in by the cooling fan, the fan duct provides a conduit to outside of the windshield module and cover element, such that the fan draws the cooler air and does not intake the heated air that is present within the windshield module or housing.

The cooling fan motor may comprise a variable speed fan motor that is controlled, e.g., by the control or controller or electronic control unit (ECU) or processor or the like, with a PWM line. The controller includes control circuitry and associated software. The PWM duty cycle may be software (SW) controlled, based on one or more inputs, such as, for example, an input based on an output of a vehicle ambient temperature sensor (that provides a temperature at or near or indicative of the temperature at the camera module), an input based on an output of a vehicle ambient light sensor (to detect sunload and thus to provide an output that is indicative of temperature at the windshield and camera module), and an input based on an output of one or more internal temperature sensors at more critical components. The fan may operate only with the necessary load and speed, in order to improve lifetime requirements based on targeted device under test (DUT) thermal mission profile.

Optionally, other cooling elements or devices may also or otherwise be implemented to cool the camera module during operation. For example, a Peltier element may be disposed at some components to increase thermal dissipation. Optionally, the camera module may include integrated liquid cooling to enhance heat dissipation away from the camera module. Optionally, a cooling fan assembly may be disposed in the vehicle separate from the camera module, whereby a channel or duct guides and directs airflow from the separate cooling fan assembly to the camera module.

The camera comprises a forward viewing camera, such as disposed at the windshield, and optionally at a windshield electronics module (WEM) or the like. The forward viewing camera may utilize aspects of the systems described in U.S. Pat. Nos. 9,896,039; 9,871,971; 9,596,387; 9,487,159; 8,256,821; 7,480,149; 6,824,281 and/or 6,690,268, which are all hereby incorporated herein by reference in their entireties.

The camera or sensor may comprise any suitable camera or sensor. Optionally, the camera may comprise a "smart camera" that includes the imaging sensor array and associated circuitry and image processing circuitry and electrical connectors and the like as part of a camera module, such as by utilizing aspects of the vision systems described in International Publication Nos. WO 2013/081984 and/or WO 2013/081985, which are hereby incorporated herein by reference in their entireties.

The system includes an image processor operable to process image data captured by the camera or cameras, such as for detecting objects or other vehicles or pedestrians or the like in the field of view of one or more of the cameras. For example, the image processor may comprise an image processing chip selected from the EYEQ family of image processing chips available from Mobileye Vision Technologies Ltd. of Jerusalem, Israel, and may include object detection software (such as the types described in U.S. Pat. Nos. 7,855,755; 7,720,580 and/or 7,038,577, which are hereby incorporated herein by reference in their entireties), and may analyze image data to detect vehicles and/or other objects. Responsive to such image processing, and when an object or other vehicle is detected, the system may generate an alert to the driver of the vehicle and/or may generate an overlay at the displayed image to highlight or enhance display of the detected object or vehicle, in order to enhance the driver's awareness of the detected object or vehicle or hazardous condition during a driving maneuver of the equipped vehicle.

The vehicle may include any type of sensor or sensors, such as imaging sensors or radar sensors or lidar sensors or ultrasonic sensors or the like. The imaging sensor or camera may capture image data for image processing and may comprise any suitable camera or sensing device, such as, for example, a two dimensional array of a plurality of photosensor elements arranged in at least 640 columns and 480 rows (at least a 640×480 imaging array, such as a megapixel imaging array or the like), with a respective lens focusing images onto respective portions of the array. The photosensor array may comprise a plurality of photosensor elements arranged in a photosensor array having rows and columns. Preferably, the imaging array has at least 300,000 photosensor elements or pixels, more preferably at least 500,000 photosensor elements or pixels and more preferably at least one million photosensor elements or pixels. The imaging array may capture color image data, such as via spectral filtering at the array, such as via an RGB (red, green and blue) filter or via a red/red complement filter or such as via an RCC (red, clear, clear) filter or the like. The logic and control circuit of the imaging sensor may function in any known manner, and the image processing and algorithmic processing may comprise any suitable means for processing the images and/or image data.

For example, the vision system and/or processing and/or camera and/or circuitry may utilize aspects described in U.S. Pat. Nos. 9,233,641; 9,146,898; 9,174,574; 9,090,234; 9,077,098; 8,818,042; 8,886,401; 9,077,962; 9,068,390; 9,140,789; 9,092,986; 9,205,776; 8,917,169; 8,694,224; 7,005,974; 5,760,962; 5,877,897; 5,796,094; 5,949,331; 6,222,447; 6,302,545; 6,396,397; 6,498,620; 6,523,964; 6,611,202; 6,201,642; 6,690,268; 6,717,610; 6,757,109; 6,802,617; 6,806,452; 6,822,563; 6,891,563; 6,946,978; 7,859,565; 5,550,677; 5,670,935; 6,636,258; 7,145,519; 7,161,616; 7,230,640; 7,248,283; 7,295,229; 7,301,466; 7,592,928; 7,881,496; 7,720,580; 7,038,577; 6,882,287; 5,929,786 and/or 5,786,772, and/or U.S. Publication Nos. US-2014-0340510; US-2014-0313339; US-2014-0347486; US-2014-0320658; US-2014-0336876; US-2014-0307095; US-2014-0327774; US-2014-0327772; US-2014-0320636; US-2014-0293057; US-2014-0309884; US-2014-0226012; US-2014-0293042; US-2014-0218535; US-2014-0218535; US-2014-0247354; US-2014-0247355; US-2014-0247352; US-2014-0232869; US-2014-0211009; US-2014-0160276; US-2014-0168437; US-2014-0168415; US-2014-0160291; US-2014-0152825; US-2014-0139676; US-2014-0138140; US-2014-0104426; US-2014-0098229; US-2014-0085472; US-2014-0067206; US-2014-0049646; US-2014-0052340; US-2014-0025240; US-2014-0028852; US-2014-005907; US-2013-0314503; US-2013-0298866; US-2013-0222593; US-2013-0300869; US-2013-0278769; US-2013-0258077; US-2013-0258077; US-2013-0242099; US-2013-0215271; US-2013-0141578 and/or US-2013-0002873, which are all hereby incorporated herein by reference in their entireties.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A vehicular windshield electronics module, the vehicular windshield electronics module comprising:

a camera module;

wherein the camera module comprises a camera housing, the camera housing accommodating a camera and circuitry;

wherein the camera comprises a lens and an imager, and wherein the imager comprises a two-dimensional array of at least one million photosensor elements arranged in a plurality of rows and columns;

wherein, with the vehicular windshield electronics module mounted at an in-cabin side of a windshield of a vehicle, the camera views through the windshield and forward of the vehicle;

wherein the camera is operable to capture image data;

wherein the circuitry comprises an image processor operable to process image data captured by the camera;

wherein the camera housing of the camera module comprises (i) lower heat dissipating fins that are disposed at a lower portion of the camera housing, and (ii) rear heat dissipating fins that are disposed at a rear portion of the camera housing;

a cooling fan assembly;

wherein the cooling fan assembly comprises a self-contained unit that includes a fan motor, fan blades and a housing, and wherein the cooling fan assembly is mounted at the lower portion of the camera housing;

wherein the fan motor comprises a variable speed motor controlled via pulse-width modulation (PWM);

wherein the cooling fan assembly, with the vehicular windshield electronics module mounted at the in-cabin side of the windshield of the vehicle, and when the fan motor is electrically powered, draws air from an interior cabin of the vehicle via an air intake of the vehicular windshield electronics module and directs the drawn air as airflow (i) in a radial direction with respect to an axis of rotation of the fan blades, and (ii) in an axial direction with respect to the axis of rotation of the fan blades; and wherein, when the cooling fan assembly directs the drawn air as airflow, the cooling fan assembly directs the airflow (i) in the radial direction along and between the lower heat dissipating fins, and (ii) in the axial direction along and between the rear heat dissipating fins.

2. The vehicular windshield electronics module of claim 1, further comprising a cover element, wherein, with the vehicular windshield electronics module mounted at the in-cabin side of the windshield, the cover element at least partially hides the camera module from view by a driver of the vehicle.

3. The vehicular windshield electronics module of claim 2, wherein, with the vehicular windshield electronics module mounted at the in-cabin side of the windshield and enclosed by the cover element, the camera module comprises an upper portion that is closer to a roof of the vehicle and a lower portion that is further from the roof of the vehicle than the upper portion, and wherein the cooling fan assembly is disposed at the lower portion of the camera module, and wherein an air intake conduit extends downward from the cooling fan assembly toward an air inlet of the cover element.

4. The vehicular windshield electronics module of claim 3, wherein the air intake conduit comprises structure that defines a passageway between an air inlet of the cooling fan assembly and the air inlet of the cover element, and wherein the structure separates the passageway from heated air present in a cavity defined between the cover element and the windshield of the vehicle.

5. The vehicular windshield electronics module of claim 4, wherein the cover element comprises an exhaust port for exhausting heated air from the cavity.

6. The vehicular windshield electronics module of claim 5, wherein the exhaust port is established through the cover element at a location spaced from the air inlet of the cover element.

7. The vehicular windshield electronics module of claim 1, wherein the image processor comprises an image processing chip, and wherein the image processing chip is in thermal conductive connection via a thermal element within the camera housing.

8. The vehicular windshield electronics module of claim 1, wherein the cooling fan assembly comprises a first exit duct that, when the fan motor of the cooling fan assembly is electrically powered, directs the airflow in the radial direction along and between the lower heat dissipating fins.

9. The vehicular windshield electronics module of claim 8, wherein the cooling fan assembly comprises a second exit duct that, when the fan motor of the cooling fan assembly is electrically powered, directs the airflow in the axial direction along and between the rear heat dissipating fins, and wherein the rear heat dissipating fins are present at the rear portion of the camera housing at a location that is juxtaposed with a location where an imager circuit board of the camera module is in thermal conductive connection with the rear portion of the camera housing, and wherein the imager is disposed at the imager circuit board.

10. The vehicular windshield electronics module of claim 1, wherein an upper portion of the camera housing comprises upper heat dissipating fins that are in thermal conductive connection with the lower heat dissipating fins.

11. The vehicular windshield electronics module of claim 1, wherein the cooling fan assembly is at least partially received in a recessed region of the camera housing.

12. The vehicular windshield electronics module of claim 1, wherein length of the camera module is less than 80 mm, and wherein width of the camera module is less than 115 mm.

13. The vehicular windshield electronics module of claim 1, wherein width of the cooling fan assembly is less than 30 mm, and wherein thickness of the cooling fan assembly is less than 7 mm.

14. The vehicular windshield electronics module of claim 1, wherein the airflow directed by the cooling fan assembly has a flow rate of at least 0.7 cubic feet per minute (CFM).

15. A vehicular windshield electronics module, the vehicular windshield electronics module comprising:

a camera module;

a cover element, wherein, with the vehicular windshield electronics module mounted at an in-cabin side of a windshield of a vehicle, the cover element at least partially hides the camera module from view by a driver of the vehicle;

wherein the camera module comprises a camera housing, the camera housing accommodating a camera and circuitry;

wherein the camera comprises a lens and an imager, and wherein the imager comprises a two-dimensional array of at least one million photosensor elements arranged in a plurality of rows and columns;

wherein, with the vehicular windshield electronics module mounted at the in-cabin side of the windshield of the vehicle, the camera views through the windshield and forward of the vehicle;

wherein the camera is operable to capture image data;

wherein the circuitry comprises an image processor operable to process image data captured by the camera;

wherein the camera housing of the camera module comprises (i) lower heat dissipating fins that are disposed at a lower portion of the camera housing, and (ii) rear heat dissipating fins that are disposed at a rear portion of the camera housing;

a cooling fan assembly;

wherein the cooling fan assembly comprises a self-contained unit that includes a fan motor, fan blades and a housing, and wherein the cooling fan assembly is mounted at the lower portion of the camera housing;

wherein the cooling fan assembly is at least partially received in a recessed region of the lower portion of the camera housing;

wherein the fan motor comprises a variable speed motor controlled via pulse-width modulation (PWM);

wherein an air intake conduit extends from the cooling fan assembly toward an air inlet of the cover element;

wherein the cooling fan assembly, with the vehicular windshield electronics module mounted at the in-cabin side of the windshield of the vehicle, and when the fan motor is electrically powered, draws air from an interior cabin of the vehicle via the air inlet of the cover element of the vehicular windshield electronics module and directs the drawn air as airflow (i) in a radial direction with respect to an axis of rotation of the fan blades, and (ii) in an axial direction with respect to the axis of rotation of the fan blades; and wherein, when the cooling fan assembly directs the drawn air as airflow, the cooling fan assembly directs the airflow (i) in the radial direction along and between the lower heat dissipating fins, and (ii) in the axial direction along and between the rear heat dissipating fins.

16. The vehicular windshield electronics module of claim 15, wherein, with the vehicular windshield electronics module mounted at the in-cabin side of the windshield and enclosed by the cover element, the camera module comprises an upper portion that is closer to a roof of the vehicle and a lower portion that is further from the roof of the vehicle than the upper portion, and wherein the cooling fan assembly is disposed at the lower portion of the camera module.

17. The vehicular windshield electronics module of claim 16, wherein the air intake conduit comprises structure that defines a passageway between an air inlet of the cooling fan assembly and the air inlet of the cover element, and wherein the structure separates the passageway from heated air present in a cavity defined between the cover element and the windshield of the vehicle.

18. The vehicular windshield electronics module of claim 17, wherein the cover element comprises an exhaust port for exhausting heated air from the cavity.

19. The vehicular windshield electronics module of claim 18, wherein the exhaust port is established through the cover element at a location spaced from the air inlet of the cover element.

20. The vehicular windshield electronics module of claim 15, wherein the cooling fan assembly comprises a first exit duct that, when the fan motor of the cooling fan assembly is electrically powered, directs the airflow in the radial direction along and between the lower heat dissipating fins.

21. The vehicular windshield electronics module of claim 20, wherein the cooling fan assembly comprises a second exit duct that, when the fan motor of the cooling fan assembly is electrically powered, directs the airflow in the axial direction along and between the rear heat dissipating fins, and wherein the rear heat dissipating fins are present at the rear portion of the camera housing at a location that is juxtaposed with a location where an imager circuit board of the camera module is in thermal conductive connection with the rear portion of the camera housing, and wherein the imager is disposed at the imager circuit board.

22. The vehicular windshield electronics module of claim 15, wherein an upper portion of the camera housing comprises upper heat dissipating fins that are in thermal conductive connection with the lower heat dissipating fins.

23. The vehicular windshield electronics module of claim 15, wherein length of the camera module is less than 80 mm, and wherein width of the camera module is less than 115 mm.

24. The vehicular windshield electronics module of claim 15, wherein width of the cooling fan assembly is less than 30 mm, and wherein thickness of the cooling fan assembly is less than 7 mm.

25. The vehicular windshield electronics module of claim 15, wherein the airflow directed by the cooling fan assembly has a flow rate of at least 0.7 cubic feet per minute (CFM).

26. A vehicular windshield electronics module, the vehicular windshield electronics module comprising:

a camera module;

wherein the camera module comprises a camera housing, the camera housing accommodating a camera and circuitry;

wherein the camera comprises a lens and an imager, and wherein the imager is disposed at an imager circuit board, and wherein the imager comprises a two-dimensional array of at least one million photosensor elements arranged in a plurality of rows and columns;

wherein, with the vehicular windshield electronics module mounted at an in-cabin side of a windshield of a vehicle, the camera views through the windshield and forward of the vehicle;

wherein the camera is operable to capture image data;

wherein the circuitry comprises an image processor operable to process image data captured by the camera;

wherein the camera housing of the camera module comprises (i) lower heat dissipating fins that are disposed at a lower portion of the camera housing, and (ii) rear heat dissipating fins that are disposed at a rear portion of the camera housing;

wherein the rear heat dissipating fins are disposed at the rear portion of the camera housing where an imager circuit board of the camera module is in thermal conductive connection with the rear portion of the camera housing;

a cooling fan assembly;

wherein the cooling fan assembly comprises a self-contained unit that includes a fan motor, fan blades and a housing, and wherein the cooling fan assembly is mounted at the lower portion of the camera housing;

wherein the fan motor comprises a variable speed motor controlled via pulse-width modulation (PWM);

wherein the cooling fan assembly, with the vehicular windshield electronics module mounted at the in-cabin side of the windshield of the vehicle, and when the fan motor is electrically powered, draws air from an interior cabin of the vehicle via an air intake of the vehicular windshield electronics module and directs the drawn air as airflow (i) in a radial direction with respect to an axis of rotation of the fan blades, and (ii) in an axial direction with respect to the axis of rotation of the fan blades;

wherein the cooling fan assembly comprises a first exit duct that, when the fan motor of the cooling fan assembly is electrically powered, directs the airflow in the radial direction along and between the lower heat dissipating fins; and wherein the cooling fan assembly comprises a second exit duct that, when the fan motor of the cooling fan assembly is electrically powered, directs the airflow in the axial direction along and between the rear heat dissipating fins.

27. The vehicular windshield electronics module of claim 26, further comprising a cover element, wherein, with the vehicular windshield electronics module mounted at the in-cabin side of the windshield of the vehicle, the cover element at least partially hides the camera module from view by a driver of the vehicle.

28. The vehicular windshield electronics module of claim 27, wherein, with the vehicular windshield electronics module mounted at the in-cabin side of the windshield and enclosed by the cover element, the camera module comprises an upper portion that is closer to a roof of the vehicle and a lower portion that is further from the roof of the vehicle than the upper portion, and wherein the cooling fan assembly is disposed at the lower portion of the camera module, and wherein an air intake conduit extends downward from the cooling fan assembly toward an air inlet of the cover element.

29. The vehicular windshield electronics module of claim 28, wherein the air intake conduit comprises structure that defines a passageway between an air inlet of the cooling fan assembly and the air inlet of the cover element, and wherein the structure separates the passageway from heated air present in a cavity defined between the cover element and the windshield of the vehicle.

30. The vehicular windshield electronics module of claim 29, wherein the cover element comprises an exhaust port for exhausting heated air from the cavity.

31. The vehicular windshield electronics module of claim 30, wherein the exhaust port is established through the cover element at a location spaced from the air inlet of the cover element.

32. The vehicular windshield electronics module of claim 26, wherein the image processor comprises an image processing chip, and wherein the image processing chip is in thermal conductive connection via a thermal element within the camera housing.

33. The vehicular windshield electronics module of claim 26, wherein an upper portion of the camera housing comprises upper heat dissipating fins that are in thermal conductive connection with the lower heat dissipating fins.

34. The vehicular windshield electronics module of claim 26, wherein the cooling fan assembly is at least partially received in a recessed region of the camera housing.

35. The vehicular windshield electronics module of claim 26, wherein length of the camera module is less than 80 mm, and wherein width of the camera module is less than 115 mm.

36. The vehicular windshield electronics module of claim 26, wherein width of the cooling fan assembly is less than 30 mm, and wherein thickness of the cooling fan assembly is less than 7 mm.

37. The vehicular windshield electronics module of claim 26, wherein the airflow directed by the cooling fan assembly has a flow rate of at least 0.7 cubic feet per minute (CFM).

\* \* \* \* \*